United States Patent [19]
Middelman et al.

[11] Patent Number: 6,016,598
[45] Date of Patent: Jan. 25, 2000

[54] METHOD OF MANUFACTURING A MULTILAYER PRINTED WIRE BOARD

[75] Inventors: Erik Middelman, Arnhem; Pieter Hendrik Zuuring, Nijmegen, both of Netherlands

[73] Assignee: Akzo Nobel N.V., Arnhem, Netherlands

[21] Appl. No.: 09/073,143

[22] Filed: May 5, 1998

Related U.S. Application Data

[63] Continuation of application No. 08/381,902, Feb. 13, 1995.

[51] Int. Cl.[7] ...................................................... H05K 3/36
[52] U.S. Cl. ................................. 29/830; 29/831; 29/846; 29/851; 156/182; 156/306.9; 156/307.7; 156/309.9; 428/901
[58] Field of Search ............................. 29/830, 831, 846, 29/851; 156/306.9, 307.7, 182, 309; 428/901, 209; 361/750, 401

[56] References Cited

U.S. PATENT DOCUMENTS

| | | | |
|---|---|---|---|
| 3,011,369 | 12/1961 | Russell | 408/239 R |
| 3,756,891 | 9/1973 | Ryan | 156/313 |
| 3,764,153 | 10/1973 | Miller | 279/86 |
| 4,287,014 | 9/1981 | Gaku et al. | 156/306.9 |
| 4,477,096 | 10/1984 | Wallace et al. | 279/86 |
| 4,606,787 | 8/1986 | Pelligrino | 216/18 |
| 4,815,347 | 3/1989 | Rogers | 82/153 |
| 4,875,282 | 10/1989 | Leibowitz | 29/830 |
| 4,943,334 | 7/1990 | Medney et al. | 156/174 |
| 4,995,768 | 2/1991 | Craft | 279/143 |
| 5,065,285 | 11/1991 | Nagai et al. | 361/792 |
| 5,179,777 | 1/1993 | Suzuki | 29/84.8 |

FOREIGN PATENT DOCUMENTS

| | | |
|---|---|---|
| 231737 | 8/1987 | European Pat. Off. . |
| 478051 | 4/1992 | European Pat. Off. . |
| 4007558 | 9/1990 | Germany . |
| 1283996 | 11/1989 | Japan . |
| 5-152755 | 6/1993 | Japan . |
| 9222192 | 12/1992 | WIPO . |

OTHER PUBLICATIONS

Ryan et al., "Additive Processing Techniques For Printed–Circuit Boards", RCA Review, Dec. 1968, pp. 582–599.
Edward F. Duffek, Ph.D., "Etching", Printed Circuits Handbook, Third Edition, Chapter 14, pp. 14.1–14.36.
Jerome J. Mikschl, Printed Circuits Handbook, Third Edition, Chapters 31–34.
IBM Technical Disclosure Bulletin vol. 32, No. 5B, pp. 355–356.
International Search Report for PCT/EP 93/02069 dated Nov. 24, 1993.

*Primary Examiner*—Lee Young
*Assistant Examiner*—Rick Kiltae Chang
*Attorney, Agent, or Firm*—Dilworth & Barrese

[57] ABSTRACT

A process for manufacturing a multi-layer printed wire board, also referred to as a multilayer, comprising at least two electrically insulating substrates with electrically conductive traces or layers provided on at least three surfaces thereof, in which process, by means of lamination under pressure, a cured basic substrate based on a UD-reinforced synthetic material, provided on either side with traces, is combined with and bonded to a back-up substrate, wherein during the laminating process the back-up substrate is added to the basic substrate, the base substrate and the back-up substrate comprising a UD-reinforced cured core layer, the base substrate having been provided at least on the side facing the back-up substrate with a still plastically deformable (flowable) adhesive layer, and such a pressure is exerted on the laminate as to bring said back-up substrate into contact or practically into contact with the conducting traces of the basic substrate, and the space between these traces is filled with the adhesive material, so bonding the basic substrate and the back-up substrate.

20 Claims, 3 Drawing Sheets

METHOD OF MANUFACTURING A MULTILAYER PRINTED WIRE BOARD

RELATED APPLICATION

This application is a continuation of U.S. application Ser. No. 08/381,902 filed Feb. 13, 1995.

TECHNICAL FIELD

The invention relates to a method of manufacturing a multilayer printed wire board. Such a printed wire board comprises at least three conductive layers, of which usually at least two are copper-layers on the outer surfaces and at least one is an internal circuit. The method to which the invention pertains comprises bonding by lamination at least one hard base substrate provided with conductive traces on at least one side and at least one intermediate substrate, the bonding involving the use of an adhesive layer in between said two substrates.

BACKGROUND OF THE INVENTION

A method of the above type has been disclosed in IBM Technical Disclosure Bulletin Vol 32 No. 5B, pages 355–356. In the known method use is made of at least one intermediate substrate which comprises a hard core layer provided with an adhesive layer at least at the side facing the conductive traces of the base substrate. The method serves to substantially eliminate the dimensional instability that usually occurs in composite lamination processes. While this can be recognized as a substantial improvement in the manufacture of multilayer boards, the disclosure fails to address an even more important problem associated with multilayer boards, namely that of providing a material displaying thermal coefficients of expansion (TCE) sufficiently low so as to match the TCE of electronic components (chips) used in conjunction with the multilayer board. A woven glass fabric (cloth) being used as the reinforcement material it is immediately apparent to the person of ordinary skill in the art that the TCEs obtained are relatively high. Further, the prior art substrates and the resulting multilayer boards require improved dimension stability.

Similar considerations apply to U.S. Pat. No. 3,756,891, which discloses a method of manufacturing multilayer PWBs involving the stacking of circuitized boards with adhesive coated sheets. The adhesive is chosen so as not to flow into the through-hole interconnection areas present in the boards.

A different approach towards multilayer PWBs is the sequential laminating technique disclosed in RCA review 29 (1968) pages 582–599, particularly pages 596–597. Although a base-substrate provided with circuitry on both sides is laminated with an adhesive coated dielectric layer, the adhesive coated layer is not an intermediate substrate in between base substrates in accordance with the invention, but serves as a substrate for a next printed circuit. The disclosure does not address the type of substrate used, let alone that it can provide a solution to the problem of providing multilayer boards having sufficiently low TCEs.

PWBs providing advantages with respect to TCE have been disclosed in U.S. Pat. No. 4,943,334. Described is a manufacturing process which comprises winding reinforcing filaments about a square flat mandrel to form a plurality of layers of filaments intersecting at an angle of 90°, providing the plurality of layers with a curable matrix material, and curing the matrix so as to form a base material for a PWB. In order to provide multilayer PWBs the disclosure teaches a method comprising providing an assembly of PWBs in a cavity, introducing a curable matrix material into the cavity, and curing the matrix so as to form a multilayer PWB. The desired reinforcement of the matrix is obtained by the presence of fibres around the PWBs, which during the process will become embedded in the cured matrix. The method fails to provide acceptable suitable results due to, inter alia an internal lack of thickness-tolerance.

In C. J. Coombs, *Printed Circuits Handbook*, published by McGraw-Hill, chapters 31 and 32, more particularly 33 and 34, it is described, int. al., how a multiple layer printed wire board, a so-called multilayer, is generally manufactured, the process being comprised of the following steps:

manufacturing a laminate coated on both sides with copper foil from glass fabric-epoxy prepreg;
  etching the desired pattern into the copper;
  bonding the etched laminates by pressing them together with intermediate layers of glass fibre-epoxy prepreg.

There are a number of drawbacks to this process, such as high materials costs on account of glass fabric being employed and high thermal expansion on account of the low maximum fibre content in fibre-reinforced laminates. Another major drawback to this process is that there is no absolute thickness tolerance. The thickness of a multilayer formed in this manner is dependent on, int. al., the moulding pressure exerted, the moulding temperature and the warming-up rate employed, and the "age" of the used prepreg and some other factors which are hard to control.

There are several variations from the latter process, e.g., as disclosed in EP 0 231 737 A2. In this known process a multilayer printed wire board is manufactured in a continuous process. In the embodiment according to FIG. 2 of this publication use is made of a single printed wire board (PWB) comprised of a substrate of two layers of glass cloth in a cured matrix of thermosetting synthetic material, which substrate is provided on both sides with a layer of copper traces formed by the subtractive method from the copper foil originally applied to the substrate. To this initial PWB there are applied, on both sides, two layers of glass cloth, a layer of liquid thermosetting material, such as epoxy resin, and a copper foil. After preheating the whole is laminated in a double belt press under the effect of heat and pressure. Thus, after cooling as it leaves the double belt press, a laminate is obtained which after the forming of copper traces in the outer layers makes a multilayer PWB. Hence this multilayer PWB is made up of a laminate of three substrates of glass cloth-reinforced cured epoxy resin and four layers with copper traces.

Although quite reasonable results can be obtained using the multilayer PWB manufactured according to this known process, it still has certain drawbacks. Notably, the layers of liquid, not yet cured thermosetting resin are greatly pressed together in the double belt press, as a result of which there is a substantial decrease of the laminate's thickness between the double belt press's inlet and its outlet. It has been found that as a result of this major change in thickness it is hard to maintain with sufficient accuracy the constant thickness of the finished laminate and of the finished multilayer PWB as ultimately desired. Deviations in a PWB's thickness have an unfavourable effect on its electrical properties, thus negatively affecting the quality of such a PWB. Another drawback to said known multilayer PWB is that reinforcing the substrates with fabrics is a comparatively costly affair.

DE-4 007 558 A1 describes a multilayer PWB of a somewhat different type. Between a number of adjacent single PWBs (cf. FIG. 1, no. 2 of DE-4 007 558 A1) which are each composed of a substrate (cf. FIG. 1, no. 4) made up of a glass cloth impregnated with a thermosetting synthetic material and provided on both sides with copper traces (of FIG. 1, no. 5), there is interposed in each case a sort of intermediate substrate (FIG. 1, nos. 1-a and 1-b). The intermediate substrate (1) consists in this case of a polyimide film (1-a) of a thickness of 10 μm which is provided on both sides with an adhesive layer (1-b) of a thickness of 10 μm or less. The melting temperature of the polyimide film is higher than the temperature used during lamination, while the adhesive layers have a melting temperature below the used lamination temperature.

A disadvantage of said known multilayer PWB consists in that there is air in the voids between the copper traces (of FIG. 1), which may have an unfavourable effect on the properties. Other disadvantages of DE-4 007 558 A1 include the high materials cost price of the described constituents and the lengthy processing time required.

In U.S. Pat. No. 4,606,787 a process for manufacturing a multilayer PWB is described which comprises first (cf. FIG. 12) making a stack of a number of single PWBs with sandwiched therebetween in each case a sort of intermediate substrate of glass fibres impregnated with liquid, uncured epoxy resin. Next, said stack is pressed together under pressure and at elevated temperature, with the resin filling the voids between the conductive traces (cf. column 6, ll. 51, 52) and being cured. The pressing together of the laminate gives a substantial reduction of its thickness, making it difficult to maintain with sufficient accuracy the constant overall thickness of the finished laminate as ultimately desired and the constant thickness of the individual intermediate substrates. This has an unfavourable effect on the PWB's electrical properties, thus negatively affecting its quality.

A multilayer printed wire board in which the dielectric material is formed of UD-reinforced layers is also disclosed in JP-A-1,283,996. The disclosed multilayers are based on the lamination of unidirectionally oriented parallel fibres (UD) containing prepreg, and so suffer from the problem that the orientation may deteriorate. Retaining orientation is crucial to enjoying the proper benefits of UD reinforcement.

Copending, not prepublished International patent application PCT/EP92/01133 (publication number WO 92/22192) (U.S. application Ser. No. 08/157,077, now U.S. Pat. No. 5,592,737) incorporated by reference herein for all purposes, provides a method in which said drawbacks have been obviated. The method described consists in that, use being made of a hard base substrate having conductive traces on both sides and an intermediate substrate comprising a hard core layer coated with an adhesive layer that is flowable at least at the side facing the conductive traces of the base substrate, lamination is conducted under a pressure sufficiently high so as to bring the core layer of the intermediate substrate into contact or virtually into contact with the conductive traces of the base substrate, the adhesive filling the voids between the traces, the base substrate and the intermediate substrate comprising a fibre-reinforced matrix material, the reinforcement being in the form of a crosswise arrangement of layers of unidirectionally (UD) oriented fibres.

SUMMARY OF THE INVENTION

It has now been found that it may be advantageous to modify the method according to said not prepublished International patent application so as to achieve a simpler process, with even better adhesion. So, the current invention comprises a method as referred to above, the improvement consisting in that the flowable adhesive layer is coated or laminated onto the circuitized base substrate. A flowable adhesive generally is an adhesive which either is fluid or can be rendered fluid (usually by means of elevated temperature). The intermediate substrate or substrates may also be adhesive-coated, though preference is given to the use of uncoated intermediate substrates. The intermediate substrate may also be provided with conductive traces or be rendered suitable for the formation of conductive traces (e.g. provided with copper foil or catalyzed for electroless plating) on one side. This embodiment particularly pertains to so-called masslam manufacturing. In this process use is made of one double-sided adhesive coated base substrate provided with conductive traces on both sides and two intermediate substrates, one on each side of the base-substrate, the intermediate substrates on the side facing away from the base substrate being provided with conductive traces or having a surface rendered suitable for being provided with conductive traces.

DETAILED DESCRIPTION OF THE DRAWINGS

Figure 1:
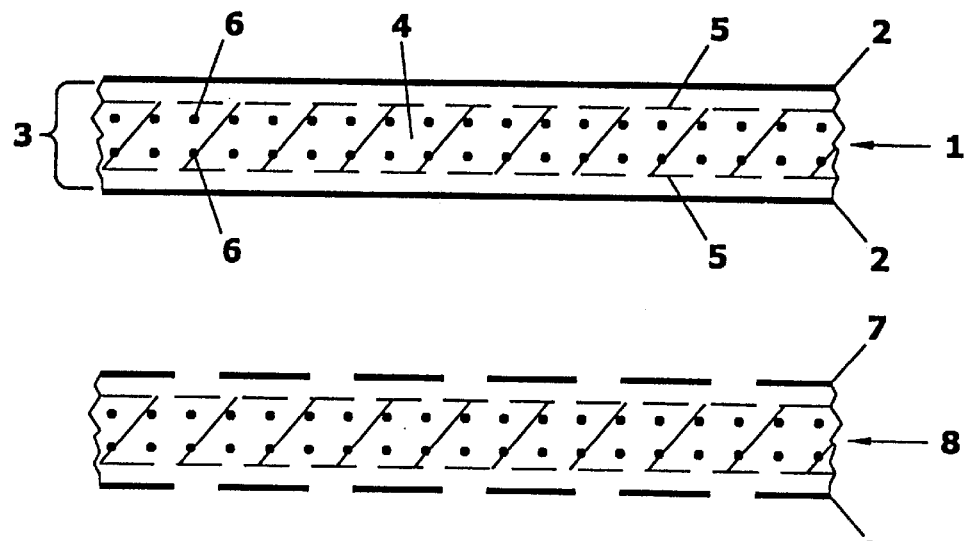
FIG. 1 shows the manufacture of a single PWB by means of the substractive method.

FIG. 1 shows a substrate 1, the outer sides of which are composed of a continuous copper foil 2 fixedly provided thereon. The core 3 of the substrate 1 is composed of a matrix 4 of a cured thermosetting synthetic material based on epoxy resin, which is reinforced with three layers of stretched filaments not bound in the form of a fabric and extending rectilinearly, with the combined thickness of the two outer layers being equal of virtually equal to the thickness of the centre layer. The two outer filament layers 5 are indicated with dash lines and the filaments in these layers extend mutually parallelly and parallel to the plane of the drawing (0° direction). The inner filament layer 6 is indicated with dottedlines and extends at right angles to the plane of the drawing (90° direction). In effect, the core 3, the thickness of which is, say, 0.4 mm, of the substrate 1 is made of layers of mutually parallel (unidirectional-UD) reinforcing filaments impregnated with a thermosetting material, such as epoxy resin. Next, the desired copper traces 7 having a thickness of, say, 35 um, are formed in the copper foils by an etching process, i.e., by the substractive method, after which the base substrate indicated in its entirety with 8 is finished.

As will be illustrated in greater detail with reference to FIGS. 2–5, said base substrate 8, which in itself is a single PWB with two layers of copper traces, forms a building component for the manufacture of a multilayer PWB.

Figure 2:
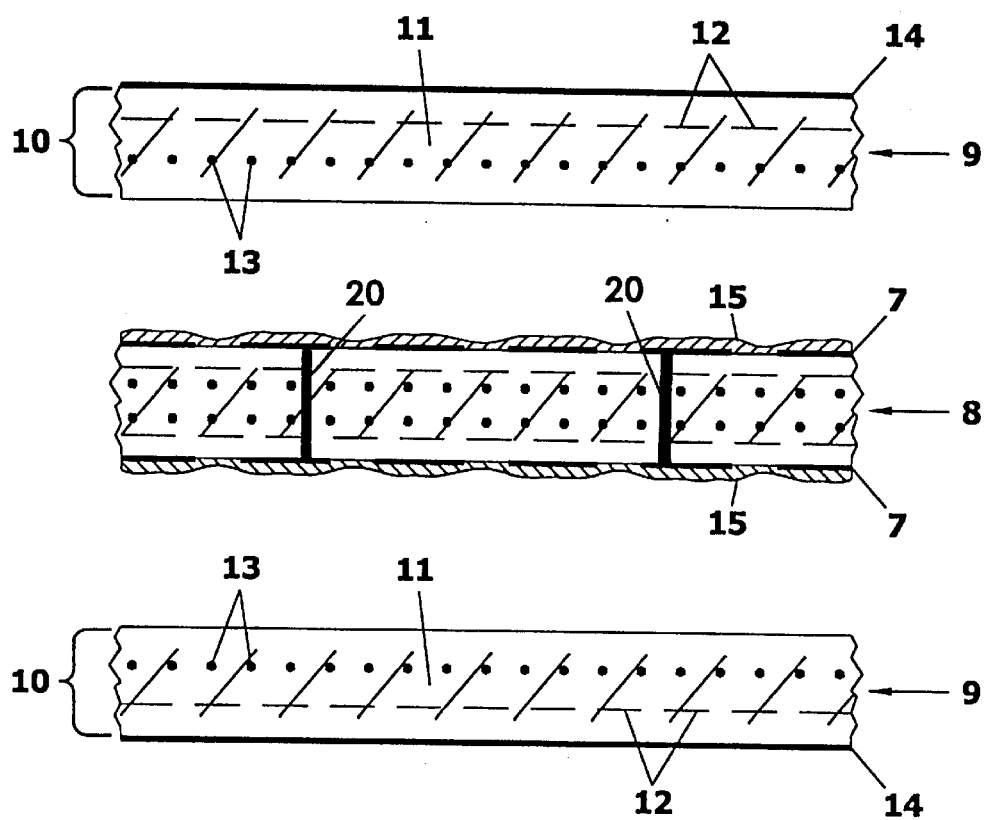
FIGS. 2–5 shows the manufacture of the substractive method of a PWB having six layers of copper traces.

To this end an intermediate substrate indicated in its entirety with 9 is e applied to either side of the base substrate 8 in the manner indicated in FIG. 2. The base substrate 8 can be provided with electrically conductive vias 20. Each intermediate substrate 9 is made up of a hard core layer 10, which has, a matrix 11 of a cured thermosetting resin, e.g. based on epoxy resin. The matrix 11 is reinforced with at least two unidirectional layers of reinforcing fibres. The filaments in the outer layers 12 of reinforcing fibres extend in the aforementioned 0° direction, while the filaments in the inner layers 13 of reinforcing fibres extend in the aforementioned 90° direction. The core 10 of the intermediate substrate 9, like the core 3 of the base substrate 8, is manufactured by laminating at least two layers reinforced with virtually unidirectional fibres, giving a hard core layer 10 with a thickness of, say, 0.4 mm. To the one side of each intermediate substrate 9 there is applied a copper foil 14 of a thickness of, say, 35 um. To each side of the base substrate 8 is applied a flowable adhesive layer 15 of a thickness of 35 um. The adhesive layer 15 is composed of a quality type of glue and preferably an uncured epoxy resin or partially cured epoxy resin. Preferably, the adhesive layer in the situation drawn in FIG. 2 is not sticky so that the base substrate can be handled without any problem.

Figure 3:
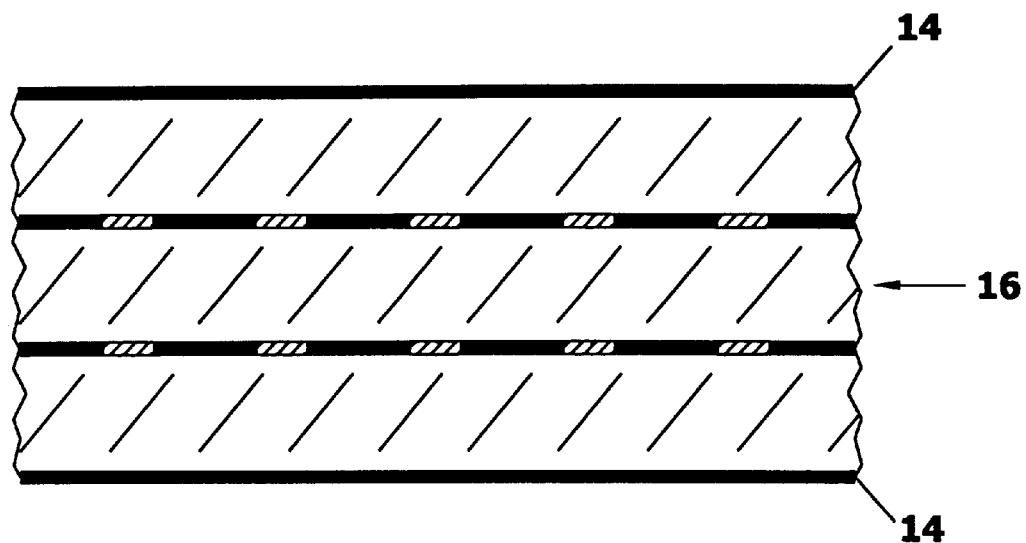

Next, the two intermediate substrates 9 with the base substrate 8 therebetween are stacked as indicated in FIG. 3, and joined together into an integrated whole under the effect of elevated temperature and external pressure. The pressing together of the stack shown in FIG. 3 is carried out under such a pressure as will bring the hard core layer 10 of the intermediate substrate 9 wholly or virtually into contact with the copper traces 7 of the base substrate and completely fill the void between these traces with glue or adhesive material 15. With the external pressure being maintained, the stack shown in FIG. 3 is subjected to such a temperature as will cure the glue 15 based on, say, epoxy resin. After the glue has been cured, a laminate 16 forming an integrated whole is obtained.

Figure 4:
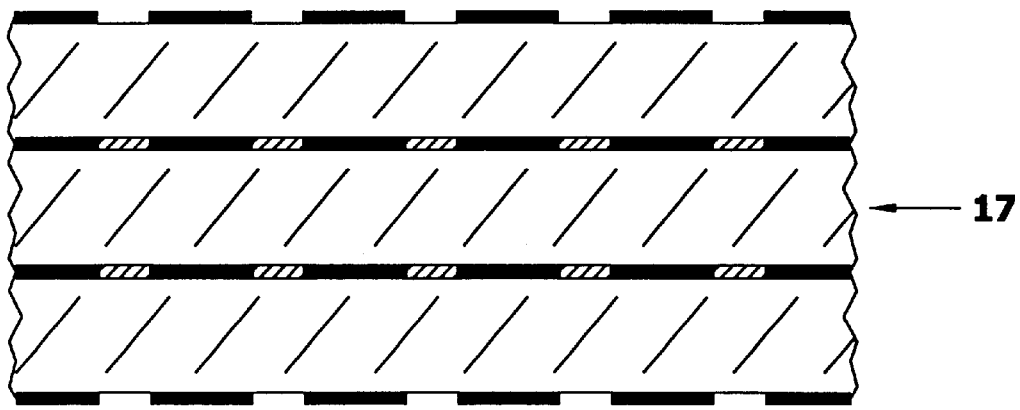

Next, the outer copper foils 14 of the laminate 16 are subjected to an etching process according 5 to the subtractive method to form the desired copper traces, giving the multilayer PWB 17 shown in FIG. 4. The PWB 17 already has four layers of copper traces.

Figure 5:
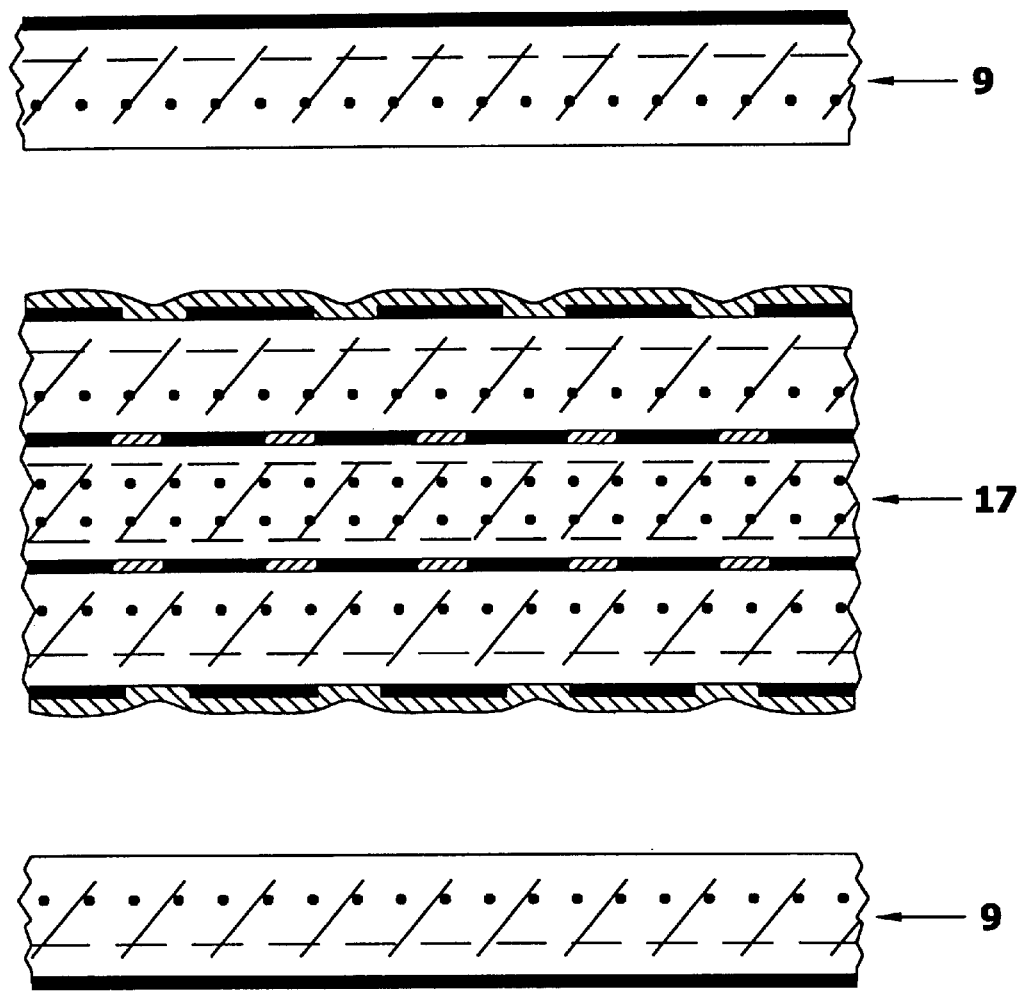

Manufacturing a PWB with six layers of copper traces may be as illustrated in FIG. 5. The members of such a PWB are indicated in FIG. 5 and consist of the centrally located PWB 17, having a flowable adhesive layer applied as above, and with on either side thereof another intermediate substrate 9 of the type described hereinbefore.

DETAILED DESCRIPTION OF THE INVENTION

Providing the circuitized board with the flowable adhesive layer can be done in several ways, including reverse roll coating, spray coating, or other coating techniques known to the man of ordinary skill in the art. The adhesive can conceivably be applied from a hot melt, but also from solution, after which the solvent is evaporated before lamination. Water-born adhesives may also be employed. Alternatively, a solid powder adhesive can be used, to be applied, e.g., by means of dip coating or electrostatic powder coating.

Preferably, the flowable adhesive is brought to a solid, tack free state before lamination, e.g. by partial curing or by being employed at a temperature below Tg, with the proviso, of course, that the flowable adhesive can still be rendered sufficiently fluid to fill the voids between the conductive traces.

Adhesion may be promoted by subjecting the base substrates and/or the intermediate substrates to a surface treatment, e.g., by roughening or modifying the surface using pumice, sand blast, abrasive paper, corona treatment, flame treatment, chemical etching techniques, etc.

For the intermediate and base substrates there is employed a reinforced matrix material which obviates the aforementioned drawbacks and notably has a sufficiently low TCE and advantageous flatness. This material comprises two or more layers of reinforcing fibres or filaments embedded in a cured thermosetting synthetic material based on, e.g., epoxy resin. The reinforcement is in the form of filament-containing layers composed of a plurality of mutually parallel stretched filaments not bound in the form of a fabric and extending substantially rectilinearly, and with filaments of superposed layers crossing each other. This type of reinforced matrix material is referred to as UD-reinforced material for short. According to the invention preferably three of said filament layers not bound in the form of a fabric are arranged in the matrix material in mirror image relative to the plane of symmetry in this process, with the filaments of superposed filament layers crossing at an angle of preferably about 90°. This UD-reinforced material, more accurately referred to as a cross-ply of UD-reinforced layers, to be suitable for advantageous use in multilayer PWBs is balanced and mid-plane symmetric. An example of such a material is formed by the substrates disclosed in the aforementioned U.S. Pat. No. 4,943,334. By virtue of the lamination method according to the invention, making use of a flowable adhesive which is not substantially present between the conductive traces of a base-substrate and the hard core of an adjacent intermediate substrate, the advantages of UD-reinforced material can be employed in a multilayer PWB.

These advantages particularly include a favorable dimension stability. Further the substrates used have relatively low TCEs in the X and Y directions, preferably about equal to those of the electrically conductive material employed (usually copper). Further, it is possible to provide substrates having coefficients of expansion in the X and Y directions about equal to the coefficient of expansion of electronic components to be used in conjunction with the multilayer PWB, more particularly silicon chips. It should be noted that these components can be applied either onto the multilayer board ("chip-on-board"), or can be embedded in a substrate such as an intermediate substrate in accordance with the present invention ("chip-in-board"). With regard to the latter embodiment an adhesive-coated substrate should be provided with open spaces for embedding the chips. Of course, it is also possible to embed the chips in spaces provided in a base-substrate. An advantageous method to manufacture a "chip-in-board" structure includes placing one or more chips on a base-substrate (and connecting it conductively with the circuitry on the base-substrate), and then laminating onto the chip-containing base-substrate an adhesive-coated intermediate substrate provided with appropriate spaces so as to surround the chip or chips attached to the base-substrate.

According to the invention, a multilayer PWB having many layers can be easily realized when each of n–1 intermediate substrates (n>2) is sandwiched between, in each case, n adjacent base substrates, followed by lamination under increased pressure (and optionally increased temperature), under vacuum, or under a combination of the two. A favorable embodiment of the process according to the invention is characterised in that the thickness of each intermediate substrate is 0.025–0.6 mm, although preferably the thickness of each intermediate substrate is of the same order of magnitude as that of a base substrate. The thickness of each still plastically deformable (flowable) adhesive layer on one or both sides of the circuitized base substrate is of the same order of magnitude as that of the conductive traces, which generally have a thickness of 2–70 $\mu$m. Preferably, the process according to the invention is characterised in that for the flowable adhesive layer provided on one or both sides of a circuitized base substrate's hard core layer use is made of a glue based on a still uncured or only partially cured thermosetting synthetic material, such as epoxy resin, which is cured after the voids between the conductive traces have been filled.

The core of the intermediate substrate and of the base substrate may be built up from a number of UD prepregs stacked in such a way that their reinforcing filaments cross each other, it is also possible to employ an alternative preparative process. Notably, the base substrate and the intermediate substrate can be manufactured by a continuous process, in which a laminate composed of the desired number of layers of stretched reinforcing filaments not bound in the form of a fabric is laid on a conveyor belt, with the filaments of superposed layers crossing each other. To the thus formed laminate of filament layers liquid thermosetting resin is applied, after which the laminate provided with resin is passed through a double belt press, in which, under the effect of heat and pressure, the filament layers are impregnated with resin and the resin is cured. As it leaves the double belt press the wholly or partially cured laminate can then be provided on one or on both sides with the relatively thin, non-sticking glue layer mentioned hereinbefore, whereupon said intermediate substrate is ready.

According to another conceivable process the cores of both the base substrate and the intermediate substrate are manufactured from several unidirectional laminates which preferably cross each other at an angle of 90°, are completely or virtually completely cured, and are bonded together with the aid of an adhesive layer. Laminates based on crossing UD laminates bonded together with an adhesive layer can be manufactured in static, optionally multiopening presses, as well as in autoclaves, double belt presses, and so-called vacuum bags.

To the matrix resin there may be added in a conventional manner fillers such as fine quartz powder and, say, glass powder such as boron silicate glass powder.

Although it is preferred to use a resin based on epoxy resin for the base substrate matrix, it is also possible in principle to employ other resins, such as cyanate resins, unsaturated polyester (UP) resins, vinyl ester resins, acrylate resins, BT-epoxy resin, bismaleimide resin (B1MI), polyimide (PI), phenol resins, triazines, polyurethanes, biscitraconic resin (BCI). Alternatively, use may be made of combinations of the aforementioned resins, and it is also possible to blend said resins with certain appropriate thermoplastic resins, such as PPO, PES, PSU, and, int. al., PEI.

A great many polymers are suitable to be used for the described glue layer, more particularly thermosetting resins, such as epoxy resin (EP), polyurethane (PU), vinyl ester (VE), polyimide (PI), bismaleimide (BMI), biscitraconic (BCI), cyanate esters, triazines, acrylates, and blends thereof Prior to application many additives can be added to the glue, such as catalysts, inhibitors, thixotropic agents, adhesion promotors like all kinds of silane coupling agents, and especially fillers. These fillers are preferably selected from the following group of materials: quartz powder, glass powder, ceramic powders, such as aluminum oxide powder. It is preferred that the fillers to be used should have a low thermal coefficient of expansion and a low dielectric constant. Favourable results can be attained by using hollow spheres as filler, which spheres may be of either a polymeric material or a ceramic material or glass.

For the aforementioned reinforcing filaments it is preferred to use filament yarns, although it is also possible to use non-continuous fibres. According to the invention the reinforcing yarns are preferably selected from the following group of materials: glass, such as E-glass, A-glass, C-glass, D-glass, AR-glass, R-glass, S1-glass, and S2-glass, and various ceramic materials, such as aluminum oxide en silicon carbide. Furthermore, fibres based on polymers are suitable, more particularly liquid crystalline polymers, such as paraphenylene terephthalamide (PPDT), polybenzobisoxazole (PBO), polybenzobisthiazole (PBT), and polybenzoimidazole (PBI), as well as fibres based on polyethylene terephthalate (PETP) and polyphenylene sulphide (PPS).

Within the framework of the invention various changes may be made. By way of unlimitative Example a multilayer printed wire board is made in accordance with the invention as follows:

A 400 mm×400 mm base substrate is manufactured in accordance with a winding process as described in U.S. Pat. No. 4,943,334. The laminate is made so as to be clad on both sides with commercially available double treated copper foil. Using conventional etching techniques (see C. J. Coombs, Jr.'s *Printed Circuits Handbook*, published by McGraw-Hill, Chapter 14), a pattern of copper traces is etched from the copper foil layers provided on this laminate, to form a double-sided printed wire board.

The double-sided printed wire board is coated with an epoxy adhesive on the basis of 36.5 parts by weight of EPIKOTE® 5050 (brominated epoxide which is the diglycidyl ether of tetrabromo bisphenol-A having an epoxy group content of 2600 mmole/kg), 63.5 parts by weight of EPIKOTE® 164 (solid cresol-formaldehyde novolak polyglycidyl ether epoxy resin having an epoxy group content of 4545 mmole/kg), and 3 parts by weight of a latent hardener, which is boron trifluoride complexed with monoethylamine, so as to form an adhesive coated PWB, i.e., an adhesive coated base substrate in accordance with the invention.

Two other 400 mm×400 mm laminates are manufactured in accordance with the U.S. Pat. No. 4,943,334 process of winding filaments about a mandrel. The laminate is made so as to be provided with copper foil on one side. The other side is provided with a PTFE release film (as a consequence of the process of winding about a mandrel), so as to form two intermediate substrates each having a bare surface on one side, in accordance with the invention.

The above-mentioned laminates, after removal of the release film, are stacked in the following order (from top to bottom):

Intermediate substrate, the bare surface facing down, the copper layer being atop;

Double sided adhesive coated double sided circuitized base substrate;

Intermediate substrate, the bare surface facing up, the copper layer facing down.

The stack is placed in a vacuum press, evacuated, and pressed while being heated to 180° C. After one hour the press is opened, and a multilayer printed wire board in accordance with the invention results.

We claim:

1. A method of manufacturing a multilayer printed wire board comprising:

providing at least a first hard-core base substrate comprising a fibre-reinforced thermoset matrix material comprising a crosswise arrangement of layers of unidirectionally (UD) oriented fibres, wherein the first hard-core base substrate has two sides and a first side of the first hard-core base substrate is provided with conductive traces and between the traces are voids;

coating the first hard-core base substrate at the first side with the conductive traces with an adhesive that is flowable;

providing at least a first hard-core intermediate substrate comprising a fibre-reinforced thermoset matrix material comprising a crosswise arrangement of layers of UD oriented fibres, wherein the intermediate substrate is adjacent to the side of the first hard-core base substrate with the conductive traces; and bonding by lamination the first hard-core base substrate and the first hard-core intermediate substrate under a pressure to result in the adhesive filling the voids that are present between the traces, the base substrate and the intermediate substrate.

2. The method of claim 1 wherein the coating step is performed only on the base substrate and is not performed on the intermediate substrate.

3. The method of claim 1 further comprising providing a second hard-core intermediate substrate, for bonding to the base substrate on a second side of the base substrate opposite that to which the first hard-core intermediate substrate is bonded.

4. The method of claim 3 wherein the base substrate is provided with conductive traces on the first and second sides and wherein the coating step is performed on both sides of the base substrate, and wherein the intermediate substrates on a side facing away from the base substrate are provided with conductive traces.

5. The method of claim 3 further comprising providing a second base substrate adjacent to the first intermediate substrate and a third base substrate adjacent to the second intermediate substrate, each of said second base substrate and said third base substrate comprising a fibre-reinforced thermoset matrix material comprising a crosswise arrangement of layers of UD oriented fibres, each of said second base substrate and third base substrate having two sides, at least one side adjacent the respective intermediate substrate, and provided on at least one side with conductive traces and between the traces are voids;

coating each of the second base substrate and the third base substrate with a flowable adhesive at the side adjacent the respective intermediate substrate, wherein each intermediate substrate is sandwiched between the adjacent first base substrate and a respective one of the second and third base substrates, and pressure is exerted on the base substrates and intermediate substrates during the bonding by lamination step for filling the void between the traces on the side of each intermediate substrate with the adhesive material.

6. The method of claim 5 further comprising providing a plurality of n−1 intermediate substrates, wherein n is an integer higher than 2;

providing a plurality of n number of base substrates adjacent to the intermediate substrates such that each intermediate substrate is sandwiched between respective base substrates, and laminating.

7. The method of claim 3 wherein the first base substrate is provided with conductive traces on both sides thereof, and wherein the coating step is performed on both sides of the first base substrate, and wherein the first and second intermediate substrates each, on a side facing away from the base substrate, have a surface rendered suitable for being provided with conductive traces.

8. The method of claim 5 wherein the bonding by lamination step is conducted under sufficient pressure and temperature to effect lamination.

9. The method of claim 5 wherein the base substrates are provided with electrically conductive vias.

10. The method of claim 9 wherein the electrically conductive vias are formed in the substrates after each bonding by lamination step.

11. The method of claim 1 wherein the conductive traces each have a first thickness, and wherein each flowable adhesive layer has a thickness of a same order of magnitude as the thickness of the conductive traces.

12. The method of claim 11 wherein the first base substrate has a thickness, and each intermediate substrate has a thickness of a same order of magnitude as the thickness of the first base substrate.

13. The method of claim 1 wherein the adhesive comprises an uncured thermosetting synthetic material.

14. The method of claim 1 wherein the matrix material of the first base substrate and the first intermediate substrate comprises a material selected from a group of thermosetting synthetic materials consisting of: cyanate resins, unsaturated polyester resins, vinyl ester resins, acrylate resins, BT-epoxy resin, bismaleimide resin, polyimide, phenol resins, triazines, polyurethanes, biscitraconic resins, and combinations of these resins.

15. The method of claim 14 wherein the matrix material further comprises a thermoplastic synthetic material.

16. The method of claim 1 wherein the matrix material of the first base substrate and the first intermediate substrate further comprises thermoplastic synthetic materials.

17. The method of claim 1 wherein the reinforcing fibre is selected from a group consisting of: A-glass, AR-glass, C-glass, D-glass, E-glass, R-glass, S1-glass, S2-glass, quartz, silica, paraphenylene terephthalamide, polybenzobisoxazole, polybenzobisthiazole, polybenzoimidazole, polyethylene terephthalate, and polyphenylene sulphide.

18. The method of claim 1 wherein the adhesive layer comprises a thermosetting synthetic material.

19. The method of claim 1 wherein the adhesive comprises a partially cured thermosetting synthetic material.

20. A multilayer printed wire board comprising:

a first hard-core based substrate including a fibre-reinforced thermoset matrix material having a crosswise arrangement of layers of unidirectionally oriented fibres, wherein the first hard-core substrate has two sides and is provided on at least one of the two sides with conductive traces and between the traces are voids; and a first hard-core intermediate substrate including a fibre-reinforced thermoset matrix material having a crosswise arrangement of layers of unidirectionally oriented fibres, wherein the first hard-core intermediate substrate is adjacent to the side of the first hard-core base substrate with the conductive traces, said first hard-core base substrate and said first hard-core intermediate substrate being bonded together by an adhesive occupying the voids between the conductive traces, the first hard-core base substrate and the first hard-core intermediate substrate.

* * * * *